United States Patent [19]
Baker

[11] Patent Number: 4,597,011
[45] Date of Patent: Jun. 24, 1986

[54] DIGITAL FILTER FOR THE LUMINANCE CHANNEL OF A COLOR-TELEVISION SET

[75] Inventor: Peotr Baker, Allington, England

[73] Assignee: ITT Industries, Inc., New York, N.Y.

[21] Appl. No.: 534,732

[22] Filed: Sep. 22, 1983

[30] Foreign Application Priority Data

Oct. 9, 1982 [EP] European Pat. Off. ............ 82710047

[51] Int. Cl.⁴ ............................................. H04N 5/14
[52] U.S. Cl. ..................... 358/166; 358/37; 358/39; 375/12
[58] Field of Search ................ 358/36, 37, 39, 31, 358/166, 167, 169, 903, 905; 375/12; 364/724

[56] References Cited

U.S. PATENT DOCUMENTS 3,775,685 11/1973 Eggimann ............................ 375/12
4,231,065 10/1980 Fitch ................................. 358/166

*Primary Examiner*—Tommy P. Chin
*Attorney, Agent, or Firm*—Donald J. Lenkszus

[57] ABSTRACT

A digital filter for the digital luminance channel of a color-television set contains an even number of cascaded delay elements whose junctions as well as the input and the output of the cascade serve as taps. Each of the taps of the half on the input side is connected to an input of a first switch, and each of the taps of the half on the output side is connected to an input of a second switch, such that the two switches are simultaneously set to two taps which are symmetrical with respect to a center tap. The center tap is connected to the first input of a single multiplier, whose second input is fed with a signal corresponding to a constant, and whose output is coupled to the first input of an adder. The output of the first switch and that of the second switch are connected, respectively, to the second and third inputs of the adder, whose output is the output of the subnetwork. Digital filters with at least one such subnetwork can be used as peaking filters in the luminance channel of color-television sets.

17 Claims, 5 Drawing Figures

DIGITAL FILTER FOR THE LUMINANCE CHANNEL OF A COLOR-TELEVISION SET

The present invention pertains to a digital filter integrated circuit for the digital luminance channel of a color-television set. More specifically, one digital filter to which the invention pertains includes a three-input adder, delay elements connected in series in groups of two and each providing a delay equal to the period of the clock signal of the digital filter, and multipliers, with part of the groups of two cascaded, the inputs of the groups of two and the output of the last group of two having taps, and the frequency of the clock signal being four times the frequency of the chrominance-subcarrier reference. A digital filter of this kind is disclosed in the journal "Fernsehund Kino-Technik", 1981, pages 317 to 323, particularly FIG. 4 on page 319.

The prior art digital filter contains a subnetwork consisting of two groups of two delay elements in which the input of the first delay element and the output of the last each have a multiplier connected thereto which multiply the signals applied to them by the same factor. The outputs of these two multipliers are connected to the three-input adder mentioned above.

From this network structure it is readily apparent that the prior art digital filter evaluates input signals of zero frequency differently, namely depending on the above-mentioned factor. Therefore, different amplitude characteristics achieved by varying this factor have different DC components. If, however, this digital filter is used in the digital luminance channel of a color-television set, this property must be compensated for, i.e., at least one further multiplier is required which compensates for the above-mentioned dependence on the multiplicative factor of the two filter multipliers. This additional multiplier is not shown in the above-mentioned FIG. 4 of the cited reference, but its presence is evident from the amplitude characteristics of FIG. 5, where the individual characteristics have a constant DC component.

The three multipliers required in the subnetwork add considerably to the expense of the circuit.

SUMMARY OF THE INVENTION

The object of the invention is to improve the prior art digital filter in such a way that particularly the additional compensating multiplier can be dispensed with, i.e., to achieve different amplitude characteristics not by varying a multiplier factor but by other means. The advantage of the prior art circuit of having a constant group delay is to be preserved. Another feature to be preserved is, of course, that the digital filter has an attenuation pole (transfer-function zero) at the frequency of the chrominance-subcarrier reference, but, in addition, the digital filter is to have an attenuation pole at 6 MHz, which frequency is used by the German Bundespost in type tests of color-television sets.

In accordance with the principles of the invention, a digital filter for the digital luminance channel of a color-television set contains an even number of cascaded delay elements whose junctions as well as the input and the output of the cascade serve as taps. Each of the taps of the half on the input side is connected to an input of a first switch, and each of the taps of the half on the output side is connected to an input of a second switch, such that the two switches are simultaneously set to two taps which are symmetrical with respect to a center tap. The center tap is connected to the first input of a single multiplier, whose second input is fed with a signal corresponding to a constant, and whose output is coupled to the first input of an adder. The output of the first switch and that of the second switch are connected, respectively, to the second and third inputs of the adder, whose output is the output of the subnetwork. Digital filters with at least one such subnetwork can be used as peaking filters in the luminance channel of color-television sets.

BRIEF DESCRIPTION OF THE DRAWINGS

The invention will be better understood from a reading of the following detailed description in conjunction with the drawings in which.

DETAILED DESCRIPTION

Figure 1:
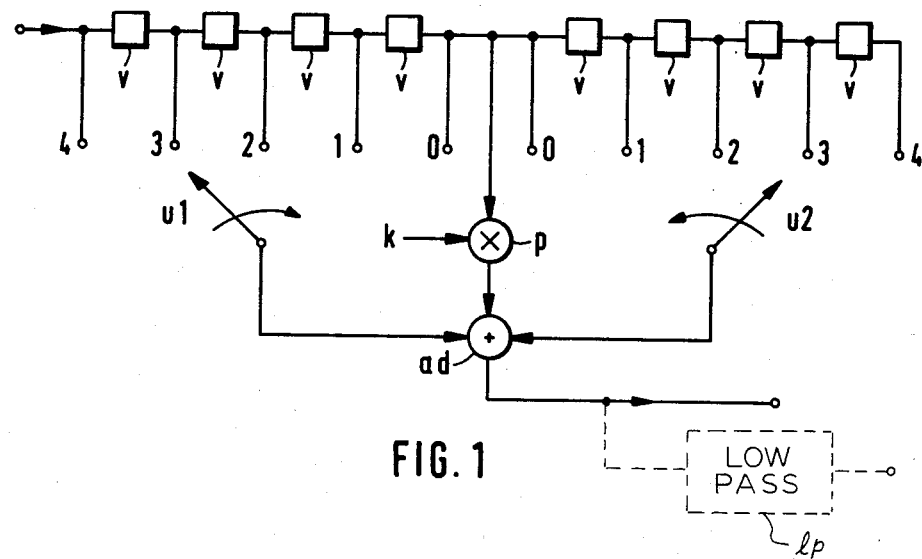
FIG. 1 shows an embodiment of the subnetwork of the digital filter according to the invention in a usual schematic digital filter diagram.

In the subnetwork for a digital filter of FIG. 1 those circuit components essential to the filter response, namely the delay elements v, the multiplier p, and the adder ad, are interconnected so as to illustrate the signal flow. Each of the delay elements v is assumed to give a delay equal to the period of the clock signal of the digital filter. In the present case, i.e., if the filter is used in the digital luminance channel of a color-television set, the frequency of this clock signal is four times the frequency of the chrominance-subcarrier reference fc. In FIG. 1, eight delay elements v, i.e., an even number of delay elements v, are connected in cascade, the input of each delay element and the output of the last delay element being provided with taps. The taps, in turn, are connected to the inputs of the two electronic multiway switches u1, u2 in a manner described below. The center tap of the cascade of delay elements v, i.e., the tap between the fourth and fifth delay elements, is shown as a triple tap for graphic reasons only, and is connected to the first input of the single multiplier p, whose second input is fed with a signal corresponding to a constant k.

Starting from and including the center tap, the taps of that half of the delay elements v located on the input side are designated 0, 1, 2, 3, 4. In a mirror image of the input side the taps of that half of the delay elements located on the output side are also designated 0 to 4. These taps are also the inputs to the two electronic multiway switches u1, u2. By selecting a suitable tap in the first and the second half, different amplitude characteristics can be set.

The output of the multiplier p is connected to the first input of the adder ad, and the outputs of the first and second electronic multiway switches u1 and u2 are connected, respectively, to the second and third inputs of this adder. The output of the adder ad is also the output of the subnetwork.

Figure 2:
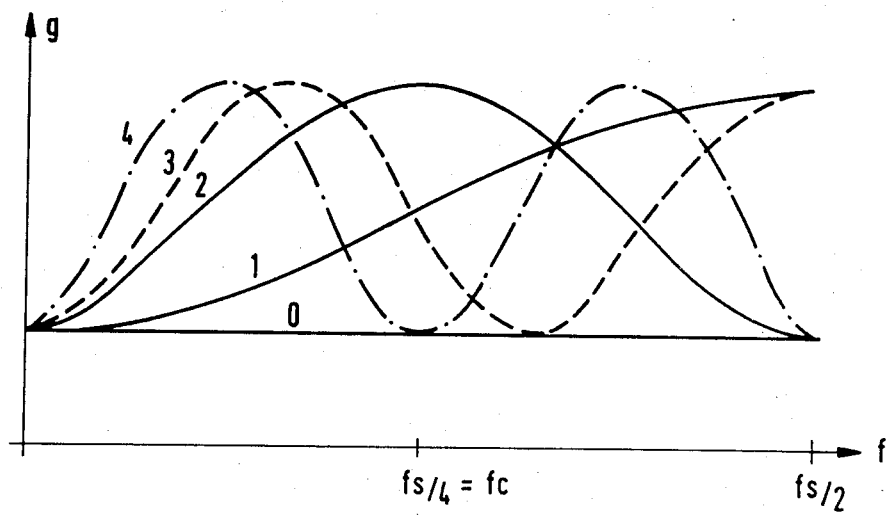
FIG. 2 shows different amplitude characteristics of the arrangement of FIG. 1.

FIG. 2 shows the variation of the amplitude g with the frequency f for the arrangement of FIG. 1 if the two electronic multiway switches u1, u2 are set to taps designated by the same reference numeral. In FIG. 2, corresponding characteristics curves are marked with these reference numerals. FIG. 2 shows that, depending on the switch positions of the electronic multiway switches u1, u2, different characteristics are present with respect to the clock frequency fs. The curve 4, for example, has a minimum at the frequency fc of the chrominance-subcarrier reference and multiples thereof, while the curve 2 has a maximum and a minimum at the frequency fc and at twice this frequency, respectively. This property can be used in the implementation of digital filters to supply attenuation poles (transfer-function zeroes).

Figure 3:
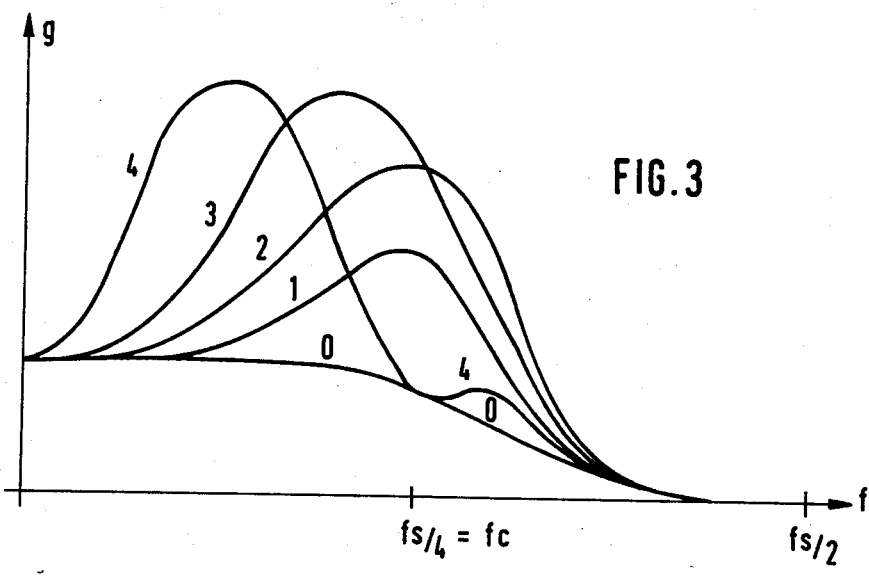
FIG. 3 shows the effect that a low pass filter has on the amplitude characteristics of the arrangement of FIG. 1.

FIG. 3 shows amplitude characteristics which are achieved with a subcircuit as shown in FIG. 1 that is followed by a digital low-pass filter lp shown in dotted lines in FIG. 1 and having an upper cutoff frequency approximately equal to or lower than the frequency fc of the chrominance-subcarrier reference.

Figure 4:
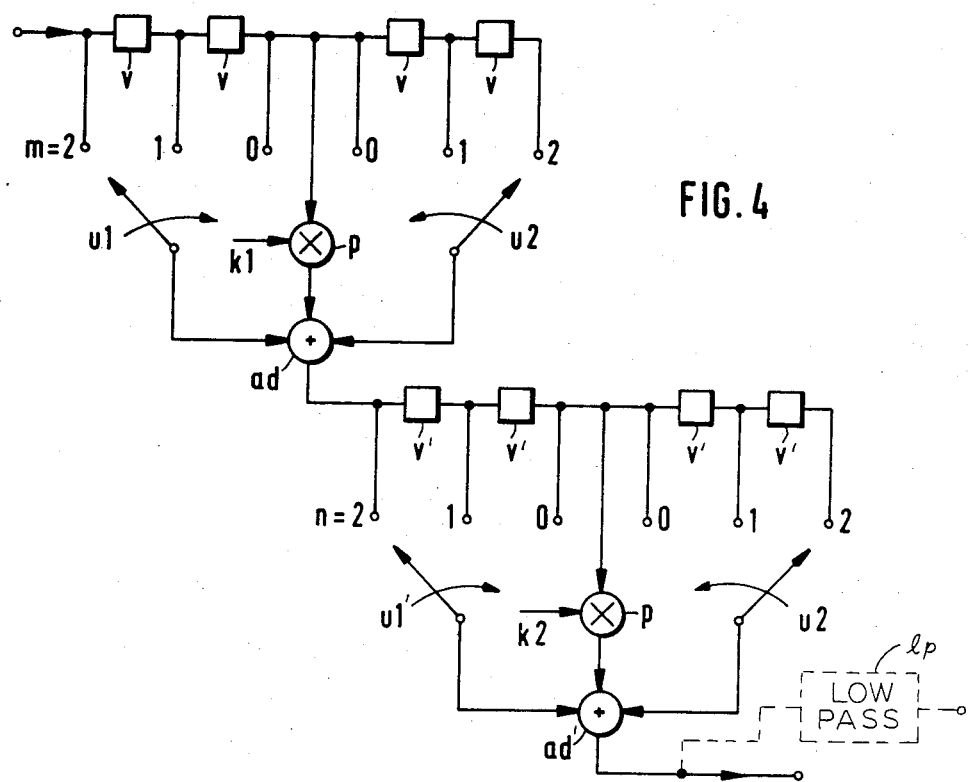
FIG. 4 shows another embodiment of the digital filter according to the invention containing two subnetworks connected in cascade.

FIG. 4 is a schematic digital filter diagram of another embodiment in which two subnetworks with the structure of FIG. 1 are cascaded. The two subnetworks contain the same number of components interconnected in the same manner. Elements in the second subnetwork have the same designators as the corresponding elements in the first subnetwork but with the addition of a prime, thus switch u1 in the first network corresponds to switch u1' in the second subnetwork. They differ only in the multiplier factors chosen, which are designated k1 in the input subnetwork of FIG. 4, and k2 in the output subnetwork, these two factors k1, k2 are thus unequal.

Each subnetwork of FIG. 4 differs from the arrangement of FIG. 1 in that only four cascaded delay elements v or v' are present, so that the two electronic switches u1, u2 or u1', u2' are only three-position switches. By setting the switches in different positions m,n, different amplitude characteristics can be achieved with the arrangement of FIG. 4.

Figure 5:
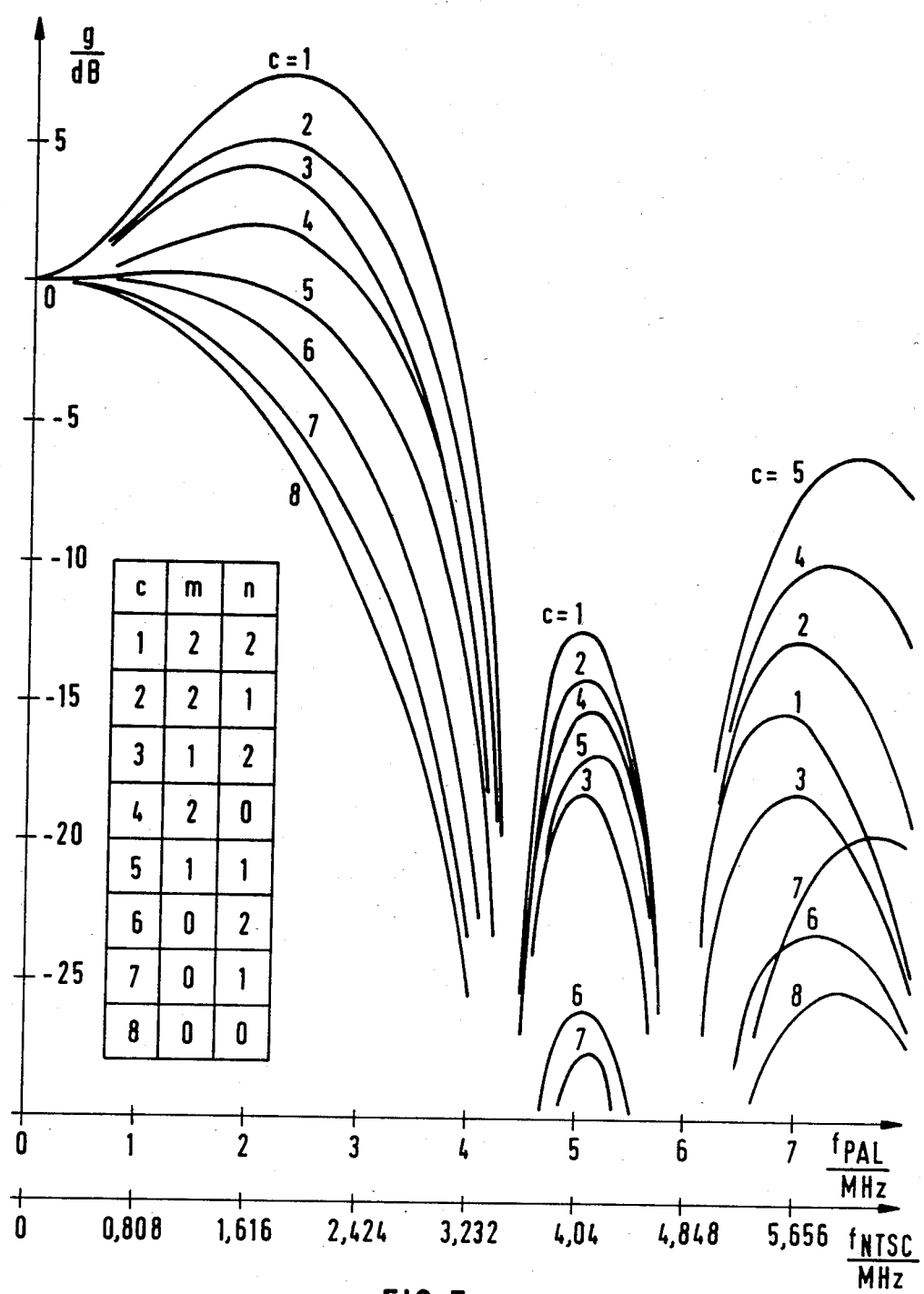
FIG. 5 shows the effect that a low pass filter has on the different amplitude characteristics of the arrangement of FIG. 4.

If a digital low-pass filter lp is added at the output of the second subnetwork of FIG. 4 as shown in dotted lines, characteristics as shown in FIG. 5 are obtained. This figure shows a family of eight curves whose family parameter is c. The individual curves are obtained for the values of m and n given in the table contained in FIG. 5. Numerical values are given for the ordinate and the abscissa. From these numbers, particularly those of the abscissa, it is apparent that the digital filter in accordance with the invention can be implemented by choosing the numerical value of the clock frequency fs both the color-television sets according to the European PAL standard and for those according to the American NTSC standard. FIG. 5 also shows that there is an attenuation pole at the chrominance-subcarrier frequency (4.43 MHz in the PAL system). A corresponding attenuation pole is supplied at the chrominance-subcarrier frequency of the NTSC standard. The curve c=8, for which m=n=0, gives the curve of the above-mentioned low-pass filter, which has an upper cutoff frequency of approximately 1.70 MHz for PAL (for NTSC correspondingly less). In the case of the curve c=8, the arrangement of FIG. 4 has a constant amplitude characteristic for all frequencies. The numerical values for the ordinate in FIG. 5 are obtained if, in the arrangement of FIG. 4, the factor k1=−3 and the factor k2=−6.

One of the advantages of the invention over the prior art digital filter mentioned at the beginning is that signal delay through the subnetwork is constant, irrespective of which amplitude characteristic is selected by setting the electronic switches u1, u2 or u1', u2'.

As the amplitude characteristics show, the digital filter in accordance with the invention can be used to produce sharper contrasts in the luminance channel ("peaking"). This means that luminance contrasts on the screen, i.e., black-white transitions or transitions from light to dark gray values, are enhanced. Since the digital filter in accordance with the invention has the same DC value for all degrees of contrast enhancement according to the amplitude characteristic selected, there is no change in gray level, however.

What is claimed is:

1. A digital filter for use in a digital luminance channel, said filter comprising:
    an input terminal;
    an output terminal;
    an adder having first, second and third inputs and an output;
    means coupling said adder output to said output terminal;
    a plurality of delay elements connected in series, each of said predetermined delay elements providing a delay, the input end of said plurality of delay elements being coupled to said input terminal, said plurality of delay elements being arranged in a first group and a second group;
    a common point between said first and second groups of delay elements;
    a first plurality of taps comprising taps on either end of said first group of delay elements and a tap intermediate each adjacent pair of delay elements of said first group;
    a second plurality of taps each corresponding to one of said first plurality of taps and comprising taps on either end of said second group of delay elements and a tap intermediate each adjacent pair of delay elements of said second group;
    multiplication means having an input coupled to said common point for multiplying signal representations at said common point by a predetermined multiplier factor to produce signals at a product output;
    said product output being coupled to said adder third input; and
    electronic switch means for sequentially connecting each of said first plurality of taps to said adder first input and for simultaneously sequentially connecting each of said second plurality of taps to said adder second input.

2. A digital filter in accordance with claim 1 wherein said coupling means comprises a digital low-pass filter.

3. A digital filter in accordance with claim 1 wherein said coupling means comprises a second adder having first, second and third inputs and an output;
    second means coupling said second adder output to said output terminal;
    a second plurality of said delay elements connected in series, the input end of said second plurality of second delay elements being coupled to said adder output, said second plurality of second delay elements being arranged in a third group and a fourth group;
    a second common point between said third and fourth groups of delay elements;

a third plurality of taps comprising taps on either end of said third group of delay elements and a tap intermediate each adjacent pair of delay elements of said third group;

a fourth plurality of taps each corresponding to one of said third plurality of taps and comprising taps on either end of said fourth group of delay elements and a tap intermediate each adjacent pair of delay elements of said fourth group;

second multiplication means having an input coupled to said second common point for multiplying signal representations at said second common point by a second predetermined multiplier factor to produce signals at a second product output, said second product output being coupled to said second adder third input; and second electronic switch means for sequentially connecting each of said third plurality of taps to said second adder first input and for simultaneously connecting a corresponding one of said fourth plurality of taps to said second adder second input.

4. A digital filter in accordance with claim 3 wherein said coupling means comprises a digital low pass filter coupled between said second adder output and said output terminal.

5. A digital filter in accordance with claim 3 wherein said predetermined multiplier factor and said second predetermined multiplier factor are not equal.

6. A digital filter in accordance with claim 5 wherein said predetermined multiplier factor equals −3 and said second predetermined multplier factor equals −6.

7. A digital filter in accordance with claim 1 wherein said electronic switch means comprises: a first multiway switch for selectively coupling said first plurality of taps to said adder first input and a second multiway switch for selectively coupling said second plurality of taps to said adder second input.

8. A digital filter in accordance with claim 3 wherein said electronic switch means comprises: a first multiway switch for selectively coupling said first plurality of taps to said adder first input and a second multiway switch for selectively coupling said second plurality of taps to said adder second input.

9. A digital filter in accordance with claim 8 wherein said second electronic switch means comprises: a third multiway switch for selectively coupling said third plurality of taps to said second adder first input and a fourth multiway switch for selectively coupling said fourth plurality of taps to said second adder second input.

10. A digital filter in accordance with claim 9 wherein said coupling means comprises a digital low pass filter coupled between said second adder output and said output terminal.

11. A digital filter in accordance with claim 9 wherein said predetermined multiplier factor and said second predetermined multiplier factor are not equal.

12. A digital filter in accordance with claim 11 wherein said predetermined multiplier factor equals −3 and said second predetermined multiplier factor equals −6.

13. A digital filter for use in a digital luminance channel, said filter comprising:
an input terminal;
an output terminal;
a plurality of subnetworks connected in cascade between said input and output terminals each subnetwork having an input and an output, the input of said first one of said plurality of subnetworks being connected to said input terminal, the output of the last one of said plurality of networks being coupled to said output terminal, each said subnetwork comprising:
an adder having first, second and third inputs and an output;
means coupling said adder output to said subnetwork output;
a plurality of delay elements connected in series, each of said delay elements providing a predetermined delay, the input end of said plurality of delay elements being coupled to said subnetwork input, said plurality of delay elements being arranged in a first group and a second group;
a common point between said first and second group of delay elements; a first plurality of taps comprising taps on either end of said first group of delay elements and a tap intermediate each adjacent pair of delay elements of said first group;
a second plurality of taps each corresponding to one of said first plurality of taps and comprising taps on either end of said second group of delay elements and a tap intermediate each adjacent pair of delay elements of said second group;
multiplication means having an input coupled to said common point for multiplying signal representations at said common point by a predetermined multiplier factor to produce signals at a product output, said product output being coupled to said adder third input; and
electronic switch means for sequentially connecting each of said first plurality of taps to said adder first input and for simultaneously sequentially connecting each of said second plurality of taps to said adder second input.

14. A digital filter in accordance with claim 13 wherein comprising digital low-pass filter connected in cascade between said output terminal and the output of the last one of said plurality of subnetworks.

15. A digital filter in accordance with claim 13 wherein said predetermined multiplier factor for each of said plurality of subnetworks is different.

16. A digital filter in accordance with claim 15 wherein comprising digital low-pass filter connected in cascade between said output terminal and the output of the last one of said plurality of subnetworks.

17. A digital filter for a digital luminance channel comprising:
an input terminal;
an output terminal;
an even number of delay elements connected in cascade to said input terminal and having taps at the junctions between adjacent delay elements, at the input and output of the cascaded structure, said cascaded structure being divided into an input half and an output half, said input and output halves each including an equal number of said delay elements;
a center tap between said input half and said output half of said cascaded structure;
a first switch having an input selectively coupleable to each of said taps of said input half of said cascaded structure and an output;
a second switch having an input selectively coupleable to each of said taps of said output half of said cascaded structure and an output;

said first and second switches being simultaneously set to taps which are symmetrical with respect to said center tap;

a multiplier having a first input coupled to said center tap, a second input for receiving a predetermined constant and an output;

an adder having a first input coupled to said multiplier output, a second input coupled to said first switch output, a third input coupled to said second switch output, and an output coupled to said output terminal.

* * * * *